(12) United States Patent
Roper

(10) Patent No.: US 11,101,809 B1
(45) Date of Patent: Aug. 24, 2021

(54) METAL VAPOR-DENSITY CONTROL SYSTEM WITH COMPOSITE MULTIPHASE ELECTRODE

(71) Applicant: HRL Laboratories, LLC, Malibu, CA (US)

(72) Inventor: Christopher S. Roper, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/898,519

(22) Filed: Jun. 11, 2020

Related U.S. Application Data

(60) Provisional application No. 62/891,482, filed on Aug. 26, 2019.

(51) Int. Cl.
| | |
|---|---|
| *G04F 5/14* | (2006.01) |
| *G01C 19/62* | (2006.01) |
| *H03L 7/26* | (2006.01) |

(52) U.S. Cl.
CPC ............ *H03L 7/26* (2013.01); *G01C 19/62* (2013.01); *G04F 5/145* (2013.01)

(58) Field of Classification Search
CPC ...... G01C 19/62; G01N 21/3103; G04F 5/14; G04F 5/145; H03B 17/00; H03L 7/26
See application file for complete search history.

(56) References Cited

U.S. PATENT DOCUMENTS

| | | |
|---|---|---|
| 3,578,834 A | 5/1971 | Porta et al. |
| 4,495,478 A | 1/1985 | Kwon et al. |
| (Continued) | | |

FOREIGN PATENT DOCUMENTS

| | | |
|---|---|---|
| WO | 1997012298 A1 | 4/1997 |
| WO | 2000043842 A2 | 2/2001 |

OTHER PUBLICATIONS

Svenja Knappe, MEMS Atomic Clocks, National Institute of Standards and Technology (NIST), Boulder, CO, USA Published by Elsevier B.V., Comprehensive Microsystems, vol. 3, pp. 571-612, 2007.

(Continued)

*Primary Examiner* — Levi Gannon
(74) *Attorney, Agent, or Firm* — O'Connor & Company

(57) ABSTRACT

Some variations provide a metal vapor-density control system comprising: a first electrode; a multiphase second electrode that is electrically isolated from the first electrode, wherein the second electrode contains an ion-conducting phase capable of transporting mobile ions and an atom-transporting phase capable of storing and transporting neutral forms of the mobile ions; and an ion-conducting layer interposed between the first electrode and the second electrode, wherein the ion-conducting layer is capable of transporting the mobile ions. The metal vapor-density control system may be contained within a vapor cell, a cold atom system, an atom chip, an atom gyroscope, an atomic clock, a communication system switch or buffer, a single-photon generator or detector, a gas-phase atom sensor, a nonlinear frequency generator, a precision spectroscopy instrument, an accelerometer, a gyroscope, an atom interferometer, a magneto-optical trap, an atomic-cloud imaging apparatus, or an atom dispenser system, for example.

28 Claims, 6 Drawing Sheets

(56) References Cited

U.S. PATENT DOCUMENTS

| | | | |
|---|---|---|---|
| 5,192,921 | A | 3/1993 | Chantry et al. |
| 7,126,112 | B2 | 10/2006 | Anderson et al. |
| 8,009,520 | B2 | 8/2011 | Jau et al. |
| 8,258,884 | B2 | 9/2012 | Borwick, III et al. |
| 8,624,682 | B2 | 1/2014 | Ridley et al. |
| 8,999,123 | B2 | 4/2015 | Bernstein et al. |
| 9,064,942 | B2 | 6/2015 | Bangsaruntip et al. |
| 9,077,354 | B2 | 7/2015 | Strabley et al. |
| 9,685,483 | B2 | 6/2017 | Nazarian et al. |
| 9,763,314 | B1 * | 9/2017 | Roper ............... H05H 3/02 |
| 9,837,177 | B1 * | 12/2017 | Roper ............... G21K 1/006 |
| 10,056,913 | B1 * | 8/2018 | Roper ............... G01C 19/62 |
| 10,545,461 | B1 | 1/2020 | Roper et al. |
| 10,775,748 | B1 | 9/2020 | Roper et al. |
| 10,828,618 | B1 | 11/2020 | Roper et al. |
| 2008/0226835 | A1 * | 9/2008 | Kasama ............ C01B 32/15 427/525 |
| 2010/0084284 | A1 * | 4/2010 | Happer ............... G04F 5/14 205/769 |
| 2011/0247942 | A1 | 10/2011 | Bernstein et al. |
| 2014/0227548 | A1 | 8/2014 | Myrick |
| 2015/0226669 | A1 | 8/2015 | Compton |

OTHER PUBLICATIONS

Jonathan J. Bernstein et al., "All Solid-State Ion-Conducting Cesium Source for Atomic Clocks," Solid State Ionics, vol. 198, No. 1, Sep. 2011.

Bernstein et al., "Solid State Electrochemical Alkali Sources for Cold Atom Sensing", Solid-State Sensors, Actuators and Microsystems Workshop, Hilton Head Island, South Carolina, Jun. 5-9, 2016.

Wan et al., "Study on the First-Principles Calculations of Graphite Intercalated by Alkali Metal (Li, Na, K)", Int. J. Electrochem. Sci., 10 (2015) 3177-3184.

* cited by examiner

METAL VAPOR-DENSITY CONTROL SYSTEM WITH COMPOSITE MULTIPHASE ELECTRODE

PRIORITY DATA

This patent application is a non-provisional application with priority to U.S. Provisional Patent App. No. 62/891,482, filed Aug. 26, 2019, which is hereby incorporated by reference herein.

STATEMENT REGARDING FEDERALLY SPONSORED RESEARCH OR DEVELOPMENT

This invention was made with Government support under Contract No. FA8650-19-C-7903 awarded by the U.S. Department of Defense. The Government has certain rights in this invention.

FIELD OF THE INVENTION

The present invention generally relates to alkali and alkaline earth vapor cells, composite electrodes for such vapor cells, and methods of using such vapor cells.

BACKGROUND OF THE INVENTION

Atom sources have importance for many applications, including (but not limited to) vapor cells. Alkali vapor cells have been used extensively since the 1960s in the study of light-atom interactions. Atom-source systems, both proposed and realized, include cold atom systems, atomic clocks, communication system switches and buffers, single-photon generators and detectors, gas-phase sensors, nonlinear frequency generators, precision spectroscopy instrumentation, accelerometers, gyroscopes, magnetometers, electrometers, gravitometers, gradiometers (including magnetic gradiometers and gravity gradiometers), and quantum memories.

Macroscale vapor cells are widely used in macroscale atomic clocks and as spectroscopy references. Macroscale vapor cells are typically 10-100 $cm^3$ in volume, which is insignificant for $m^3$ scale atomic clocks, but far too large for chip-scale atomic clocks which are at most a few $cm^3$ in volume.

Chip-scale atomic clocks and navigation systems require miniature vapor cells, typically containing cesium or rubidium, with narrow absorption peaks that are stable over time. Miniature vapor cells, and methods of filling them with alkali metals, have been described in the prior art. However, it has proven difficult to control vapor density in a miniature vapor cell through the methods described in the literature.

There are several reasons why it is difficult to control vapor density in a miniature vapor cell. First, it is difficult to load a precise amount of alkali metal into a miniature vapor cell. Second, the amount of alkali vapor in a vapor cell changes over time as the vapor adsorbs, diffuses, and reacts with the walls. Alkali metal vapor pressure may be changed with a small set of known technologies (see Monroe et al., *Phys Rev Lett* 1990, 65, 1571; Scherer et al., *J Vac Sci & Tech A* 2012, 30; and Dugrain, *Review of Scientific Instruments*, vol. 85, no. 8, p. 083112, August 2014). However, these systems are slow, complex, and/or have a short longevity.

A number of patents and patent applications discuss miniature vapor cells and methods of filling them with alkali metals. See U.S. Pat. No. 8,624,682 for "Vapor cell atomic clock physics package"; U.S. Pat. No. 8,258,884 for "System for charging a vapor cell"; U.S. Pat. No. 5,192,921 for "Miniaturized atomic frequency standard"; WO 1997012298 for "A miniature atomic frequency standard"; and WO 2000043842 for "Atomic frequency standard."

Traditionally, alkali metals have been introduced into magneto-optical trap (MOT) vacuum systems via difficult-to-control preparation steps, such as manually crushing a sealed alkali-containing glass ampule inside a metal tube connected to the vacuum system via a control valve. See Wieman, *American Journal of Physics*, vol. 63, no. 4, p. 317, 1995. This approach requires external heating to replenish the alkali metal inside the vacuum system as needed, which is a slow process with little control over the amount of alkali metal delivered. The manual labor is non-ideal for automated systems or chip-scale devices.

An alternative exists in the now-common alkali metal dispensers, which are effectively an oven-controlled source of alkali metal, whereby the desired alkali metal is released by chemical reaction when a current is passed through the device. While this process automates the release of alkali metal into the vacuum system, it has difficulty in fabrication compatibility with chip-scale cold-atom devices. Further, the timescales required for generating (warm up) and sinking (pump down) alkali are typically on the order of seconds to minutes, and can vary greatly depending on the amount of alkali metal built up on the vacuum system walls.

A rapidly pulsed and cooled variant of the alkali metal dispenser has been developed to stabilize the residual Rb vapor pressure in 100 millisecond pump-down time, but the device requires large-dimension Cu heat sinks and complicated thermal design (Dugrain, *Review of Scientific Instruments*, vol. 85, no. 8, p. 083112, August 2014) which may not easily translate to miniaturization.

Double MOTs wherein the first MOT is loaded at moderate vacuum, and then an atom cloud is transferred to a second high-vacuum MOT, have been implemented on the laboratory scale. Again, these systems require complicated dual-vacuum systems and controls as well as a transfer system to move the atom cloud from one MOT to the other, none of which is amenable to chip-scale integration.

Light-induced atomic desorption (LIAD) is a recent technique that solves some of the long pump-down times by only releasing a small amount of alkali using a desorption laser; however, this method requires preparing a special desorption target in the MOT vacuum chamber. The desorption laser can interfere with the trapping lasers of the MOT (see Anderson et al., *Physical Review A*, vol. 63, no. 2, January 2001). It also has yet to demonstrate time constants below 1 second.

Bernstein et al. have developed a solid-state ionic concept based on Cs conducting glass; see U.S. Pat. No. 8,999,123 and U.S. Patent App. Pub. No. 20110247942. However, this technology has drawbacks. For example, the Cs conducting glass has very low ion conductivity. The implications of this are shown in Bernstein et al., "All solid state ion-conducting cesium source for atomic clocks," *Solid State Ionics* Volume 198, Issue 1, September 2011, Pages 47-49, in which >1000 V applied voltage and elevated temperature (~170° C.) are required to change the alkali content on time scales of ~100 seconds. In this work, a monolithic back electrode in the form of silver metal is employed. Using a different metal from the alkali species being emitted from the device enables short-term device operation, but this contaminates the solid electrolyte and limits the usable lifetime for the device. Furthermore, once the silver metal is depleted in the region where the silver contacts the ion conductor, gaps may form, reducing the interfacial contact area between the ion conductor and the back electrode, thus reducing the alkali transport rate. Reversing the flow of alkali through the device does not guarantee that silver will redeposit into the gaps in the back electrode exactly where it was removed.

In Bernstein et al., "SOLID STATE ELECTROCHEMICAL ALKALI SOURCES FOR COLD ATOM SENSING," Solid-State Sensors, Actuators and Microsystems Workshop, South Carolina, June 2016 (pages 180-184), inert Pt electrodes with 130 V are used to reduce Rb vapor pressure using Rb-beta-alumina. The backside electrodes contain a metal that is ionized and injected into the solid electrolyte (e.g. Ag) that is different from the desired atoms in the vapor phase of the vapor cell (e.g. Cs or Rb). This may contaminate the solid electrolyte and limit the usable lifetime for the device.

Graphite has been used as a sink for stray alkali atoms in atomic systems. Compton has employed heated graphite to control the vapor pressure of alkali atom vapor (U.S. Patent App. Pub. No. 20150226669). Using graphite in this manner does not make use of electrochemistry. Alkali atoms diffuse into and out of the graphite as the equilibrium vapor pressure of the alkali atom vapor changes, by changing the temperature of the graphite. There are a number of drawbacks to this approach. The alkali vapor pressure is indirectly controlled through temperature. The graphite must be thermally isolated from the rest of the cell, thus increasing device complexity. Finally, heating the graphite will require significant power, thus limiting portability.

An atom chip is an arrangement of microfabricated current-carrying wires patterned on a substrate which is used to trap and control atoms via the strong magnetic field gradients offered at distances close to conductors. Atom chips enable highly sophisticated experiments to be condensed into areas on the order of a few square centimeters and readily lend themselves to the miniaturization and integration of cold atom systems for practical applications beyond the laboratory.

Atom chips use metal traces patterned via lithographic techniques to create magnetic fields involved in trapping populations of atoms. See U.S. Pat. No. 7,126,112 for "Cold atom system with atom chip wall"; Fortagh et al., *Rev. Mod. Phys.* 79, 235 (2007) Reichel et al., *Atom Chips*, Wiley, 2011; and Treutlein, *Coherent manipulation of ultracold atoms on atom chips*, Dissertation, Ludwig-Maximilians-University Munich, 2008, which is hereby incorporated by reference. Atom chips typically are implemented as one wall of a vapor cell. Thus they suffer from the same issues—such as slow vapor pressure rate of change and loss of alkali vapor to the walls—as conventional vapor cells. Improvements to conventional vapor cells in which magnetic trapping fields are generated by magnets or electromagnets outside the vapor cell also apply to atom chips for which magnetic fields are generated by magnets or electromagnets inside the vapor cell.

In view of the aforementioned shortcomings in the art, there is a desire for improved metal vapor-density control systems.

SUMMARY OF THE INVENTION

The present invention addresses the aforementioned needs in the art, as will now be summarized and then further described in detail below.

Some variations provide a metal vapor-density control system comprising:
a first electrode;
a second electrode that is electrically isolated from the first electrode, wherein the second electrode contains (i) an ion-conducting phase capable of transporting mobile ions and (ii) an atom-transporting phase capable of storing and transporting neutral forms of the mobile ions; and
an ion-conducting layer interposed between the first electrode and the second electrode, wherein the ion-conducting layer is capable of transporting the mobile ions, and wherein the ion-conducting layer is in contact with the second electrode.

In some embodiments, the first electrode contains a porous, electrically conductive layer or structure, such as a fine-pitch metal grid.

In some embodiments, the first electrode contains a permeable, electrically conductive layer or structure.

In some embodiments, the first electrode contains a layer of an intercalation compound, such as a carbonaceous material selected from the group consisting of graphite, graphene, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

In some embodiments relating to vapor cells, the first electrode is disposed in contact with a vapor-cell region.

The ion-conducting phase preferably has an electrical conductivity of at least 0.1 S/cm measured at 25° C. Alternatively, or additionally, the second electrode may further contain (iii) an electron-conducting phase with an electrical conductivity of at least 0.1 S/cm measured at 25° C.

In some embodiments, the ion-conducting phase contains a mixed ion-electron conductor, such as one selected from the group consisting of alkali monoferrites, alkali monoaluminates, alkali monogallates, and combinations thereof, optionally doped with one or more atoms selected from the group consisting of Pb, Cd, Ca, P, V, Nb, Ta, Si, Ti, and Ge. In these or other embodiments, the ion-conducting phase contains a mixed ion-electron conductor selected from alkali pyrophosphates, optionally doped with one or more atoms selected from the group consisting of Ca, Sr, Ba, Pb, Y, La, and Nd.

In some embodiments, the ion-conducting phase forms a continuous or semi-continuous phase within the second electrode.

In some embodiments, the ion-conducting phase is structurally integrated with a side of the ion-conducting layer.

In some embodiments, the atom-transporting phase contains an intercalable compound that is intercalative for the neutral forms of the mobile ions. For example, the intercalable compound may be a carbonaceous material, which in certain embodiments is selected from the group consisting of graphite, graphene, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof. In other embodiments, the intercalable compound is a transition-metal oxide, a transition-metal dichalcogenide, or a combination thereof. Combinations of a transition-metal oxide, a transition-metal dichalcogenide, and a carbonaceous material may also be employed.

In some embodiments, the atom-transporting phase contains atomic species that are different than the neutral forms of the mobile ions.

In some embodiments, the atom-transporting phase has an electrical conductivity of at least 0.1 S/cm measured at 25° C.

The atom-transporting phase may be in the form of a plurality of discrete particles within the second electrode.

In certain embodiments, the interfacial contact area density between the ion-conducting phase and the atom-transporting phase is at least 100 mm$^2$ per mm$^3$. In these or other embodiments, the interfacial contact area between the ion-conducting phase and the atom-transporting phase includes a binder and/or an interfacial layer.

The second electrode may be in contact with an atom reservoir region.

The ion-conducting layer may actually contain the mobile ions, such as during operation or in preparation for operation of the metal vapor-density control system. In various embodiments, the mobile ions are selected from the group consisting of $Rb^+$, $Cs^+$, $Ca^{2+}$, $Na^+$, $K^+$, $Sr^{2+}$, $Li^+$, $Yb^{3+}$, and combinations thereof.

In some embodiments, the ion-conducting layer comprises a solid electrolyte. The ion-conducting layer may comprise a material selected from the group consisting of β-alumina, β"-alumina, and combinations thereof. Alternatively, or additionally, the ion-conducting layer may comprise a material selected from the group consisting of NASICON, LISICON, KSICON, chalcogenide glasses, and combinations thereof.

In some embodiments, the material of the ion-conducting layer is the same as the material of the ion-conducting phase that is contained in the second electrode.

In some embodiments, the metal vapor-density control system further includes a heater attached thereto, or in thermal or electromagnetic communication therewith.

In some embodiments, the metal vapor-density control system is a vapor-cell system comprising a vapor-cell region configured to allow at least one vapor-cell optical path into a vapor-cell vapor phase within the vapor-cell region.

The metal vapor-density control system may be part of an atom-chip system, for example.

DETAILED DESCRIPTION OF EMBODIMENTS OF THE INVENTION

Figure 1:
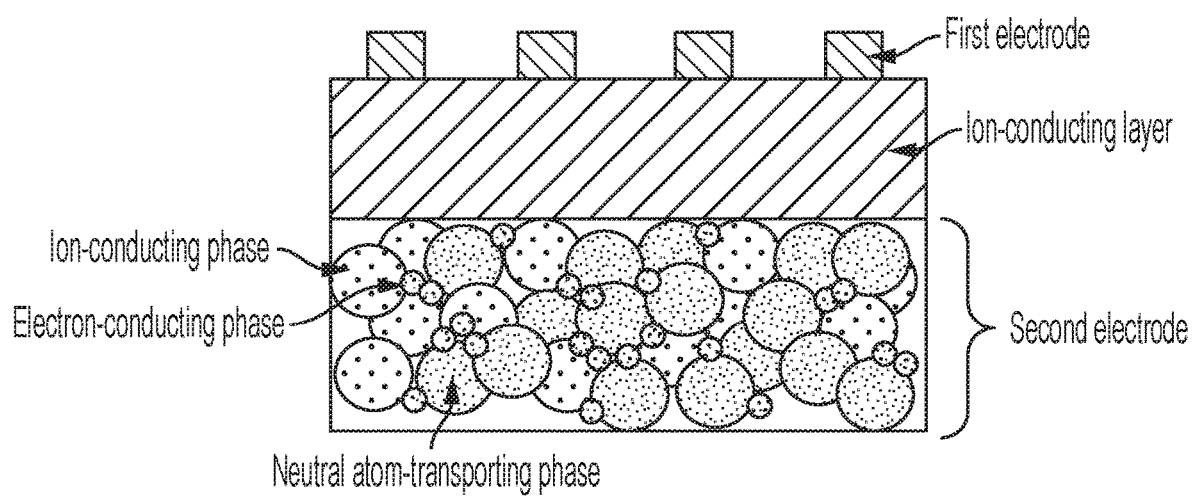
FIG. 1 is a schematic illustration of a metal vapor-density control system in which particles of the ion-conducting phase, the electron-conducting phase, and the neutral atom-transporting phase of the second electrode are sintered or otherwise bound together.

The structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Some variations of the invention provide a metal vapor-density control system containing a solid-state electrochemical reversible metal atom source with a multiphase back (second) electrode. The multiphase back electrode contains phases to transport metal ions (e.g., alkali ions), neutral metal atoms (e.g., alkali neutrals), and electrons. Note that much of this specification will be directed to the metal being alkali metal, but it shall be understood that the invention is not limited to alkali metals. For instance, alkaline earth metals, rare earth metals, or other metals may be used instead. Any reference to alkali is in reference to exemplary embodiments only.

The phases of the multiphase back electrode are preferably configured with high interfacial area and short diffusion lengths for alkali neutrals, leading to high alkali transport rates in the back electrode and thus high overall alkali sourcing and sinking by the metal vapor-density control system and the device containing the control system.

Previous devices proposed and demonstrated for controlling alkali vapor pressure using solid electrolytes (ion conductors) have used monolithic back electrodes, sometimes with features to enhance electron conduction. The rate of alkali transport through these conventional devices can be limited by the rate of alkali diffusion in the back electrode. The present inventors have realized that by introducing a distinct phase with significant alkali ion conductivity in the back electrode, the interfacial area between the back electrode and the ion conductor can be increased by orders of magnitude. Additionally, with distinct phases, the maximum distance between the alkali neutral storage compound and the ion conductor can be reduced by orders of magnitude, thus increasing alkali metal sourcing and/or sinking rates significantly.

The purpose of this invention, in some variations, is to control the vapor pressure (and thus density) of alkali atoms or other metal atoms. Electrical inputs enable controlled dosing of metal atoms (e.g., alkali atoms) into and out of a vapor cell or other atom source. This invention enables active, bidirectional control of metal vapor pressure within a vapor cell or other system. An advantage of preferred embodiments of the present invention is an orders-of-magnitude improvement in the rate of metal transport through the back electrode, compared to the prior art.

The ability to control the vapor pressure of alkali atoms has multiple applications, such as those related to atomic physics. This invention is applicable for portable and highly-precise position, navigation, and timing systems, for example.

For instance, the ability to control the vapor pressure of alkali atoms can enable long population lifetimes of cold atoms, particularly in miniaturized atomic systems. Cold atoms (such as at temperatures of about 1 nK to about 1 K, typically from about 100 µK to about 1000 µK) are useful for precision timing and navigation applications, e.g. in cold atom clocks and in atomic interferometry. In certain applications such as Bose-Einstein condensate, cold atoms can be made that are in the nanokelvin range or even less (1 nK=$10^{-9}$ K), such as about 0.5 nK.

Cold atoms are typically formed from a subset of warmer atoms inside a vapor cell, e.g. through trapping and cooling in a magneto-optical trap (MOT). The time constant of the cold-atom population depends on the density of other atoms in the vapor cell because of collisional heating. For fast loading (i.e. short time constant on loading), it is desirable to have a high vapor density of atoms. However, for highly stable and highly precise measurement, it is desirable to have the population of cold atoms last as long as possible. Therefore it is desirable to have a long time constant and low vapor density once the population of cold atoms has been cooled and trapped. The active control of the vapor density in a vapor cell, provided in this patent application, enables a fast loading time as well as a long lifetime.

Additional cooling of metal atoms may be performed with a dipole trap and evaporative cooling, forming a Bose-Einstein condensate, for example. Typically, formation of a Bose-Einstein condensate requires two spatially separate regions with a vapor cell or vacuum system, one with higher alkali vapor density for magneto-optical trap loading and another with lower vapor density to cool the magneto-optical trap into a Bose-Einstein condensate. In order to make Bose-Einstein condensates with a portable instrument, it is desirable to reduce the size of the vacuum system. Modulating the alkali vapor pressure in time, using the principles disclosed herein, enables the formation of Bose-Einstein condensates in a single region-thus achieving a reduction in the vacuum system size compared to current Bose-Einstein condensate systems.

Additionally, the ability to source alkali atoms with low power and with the emission of no other chemical species is desirable. Conventional alkali dispenser sources require high currents ($\geq 5$ A is typical) and high power (e.g., Società Apparecchi Electrici e Scientifici (SAES) Getters, Milan, Italy). For portable battery-powered atomic clock applications, a power budget of watts will yield device lifetimes so short as to be impractical. Furthermore, alkali dispenser sources emit non-alkali gases in their initial period of operation. For a system connected to a vacuum pump, this is often not a concern. However, for portable atomic physics systems that are infrequently or never serviced, non-alkali gases can shift or broaden the atomic transition frequency and/or increase the vapor cell pressure high enough to prevent the formation of a population of cold atoms.

In this specification, "source," "sink," "source and/or sink", "source/sink" or the like may be used herein to refer to a source of metals; a sink of metals; or a material or structure that acts as either a source or sink of metals, depending on local conditions (e.g., temperature, pressure, or electrical potential), concentrations of species, etc. For convenience, "alkali" or "alkali metal" may be used in this specification to refer to one or more alkali metals, one or more alkaline earth metals, or a combination thereof. Alkali metals include Li, Na, K, Cs, Rb, or Fr. Alkaline earth metal include Be, Mg, Ca, Sr, Ba, and Ra. Note that the present invention, however, is not limited to the metal being alkali or alkaline earth metals.

Generally, the metal vapor-density control system may be a system arranged to supply multiple cold atoms within a device or confined region for the purposes of one or more measurements based on those atoms. Note that "measurements" shall be broadly construed to include any application (i.e., system, device, or method) which utilizes or is capable of utilizing a source of atoms, two electrodes, and an ion-conducting layer between the electrodes. Measurements are usually spectroscopy-based, using lasers and/or RF to measure an external field or an energy level of the atoms.

The metal vapor-density control system may be, or be contained within, a vapor cell, a cold atom system, an atom chip, an atom gyroscope, an atomic clock, a communication system switch or buffer, a single-photon generator or detector, a gas-phase atom sensor, a nonlinear frequency generator, a precision spectroscopy instrument, an accelerometer, a gyroscope, an atom interferometer, a magneto-optical trap, an atomic-cloud imaging apparatus, or an atom dispenser system, for example.

Some variations provide a metal vapor-density control system comprising:

at least one first electrode;

at least one second electrode that is electrically isolated from the first electrode, wherein the second electrode contains (i) an ion-conducting phase capable of transporting mobile ions and (ii) an atom-transporting phase capable of storing and transporting neutral forms of the mobile ions; and an ion-conducting layer interposed between the first electrode and the second electrode, wherein the ion-conducting layer is capable of transporting the mobile ions, and wherein the ion-conducting layer is in contact with the second electrode.

An "electrode" is a region that is electrically conductive or includes one or more material phases that are themselves electrically conductive.

The first electrode is in contact with the ion-conducting layer but is not in contact with the second electrode. The first electrode permits the conduction of electrons. The first electrode is preferably characterized by an electrical sheet resistance of less than about 10 M$\Omega$/square, more preferably less than about 100 k$\Omega$/square, and most preferably less than about 1 k$\Omega$/square, measured at 25° C. The electrical resistivity of the first electrode is preferably less than about 100 k$\Omega$·cm, more preferably less than about 10 k$\Omega$·cm, even more preferably less than about 0.1 k$\Omega$·cm (100 $\Omega$·cm), and most preferably less than about 0.01 k$\Omega$·cm (10 $\Omega$·cm) or 0.001 k$\Omega$·cm (1 $\Omega$·cm), measured at 25° C.

In some embodiments, the first electrode permits the conduction of the same ionic species as is conducted in the ion-conducting layer. In some embodiments, the first electrode is characterized by an ionic conductivity, for the same ionic species as is conducted in the ion-conducting layer, of at least about $10^{-10}\cdot cm^{-1}$, more preferably at least about $10^{-8}\Omega^{-1}\cdot cm^{-1}$, and most preferably at least about $10^{-6}\Omega^{-1}\cdot cm^{-1}$, measured at 25° C. (note that the units $\Omega^{-1}\cdot cm^{-1}$ are the same as S/cm). The ionic conductance (through the electrode thickness) of the first electrode is preferably less than about 10 k$\Omega$, more preferably less than about 1 k$\Omega$, and most preferably less than about 0.1 k$\Omega$ (100$\Omega$), measured at 25° C.

Alternatively, or additionally, the first electrode may permit diffusion of the reduced form of the same ionic species as is conducted in the ion-conducting layer. In some embodiments, the first electrode is characterized by a diffusivity, for the neutral form of the same ionic species as is conducted in the ion-conducting layer, of at least about $10^{-10}$ cm$^2$/s, more preferably at least about $10^{-6}$ cm$^2$/s, measured the device-operation temperature, such as 25° C.

In various embodiments, the first electrode may be a porous and electrically conductive structure, a selectively permeable and electrically conductive structure that is not necessarily porous, a mixed ion-electron conductor, or a combination thereof. For examples of selectively permeable and electrically conductive structures, see U.S. Pat. No. 10,545,461 to Roper et al., issued on Jan. 28, 2020, which is hereby incorporated by reference herein. For examples of mixed ion-electron conductors, see U.S. patent application Ser. No. 15/837,346, filed on Dec. 11, 2017, which is hereby incorporated by reference herein.

In some preferred embodiments, the first electrode is a porous electrically conductive layer or other structure. For example, the porous electrically conductive layer or other structure may be a patterned metal layer directly on one surface of the ion-conducting layer (see FIGS. 1 to 5). The patterned metal layer is electrically conductive.

The patterned metal layer is preferably thin, measured in the direction perpendicular to the ion-conducting layer. Preferably, the patterned metal layer has a thickness of about 1 micron or less, such as less than 200 nanometers, or less than 100 nanometers. The patterned metal layer may have a pattern characterized by regions of metal separated by regions of open space or another material that is not metal. The regions of metal may have average thickness, measured in the direction parallel to the ion-conducting layer, of about 100 microns or less, such as about 50 microns or less, about 10 microns or less, about 2 microns or less, about 1 micron or less, or about 500 nanometers or less. The regions between metal may be closely spaced, such as a line pitch of about 100 microns or less, about 50 microns or less, about 10 microns or less, about 5 microns or less, about 2 microns or less, or about 1 micron or less.

The patterned metal layer may be patterned with photolithography, electron beam lithography, direct write lithography, direct write metal deposition (e.g., ion beam-induced deposition), interference lithography, sphere lithography, or nanoimprint lithography, for example.

The porous electrically conductive layer preferably does not chemically interact with the ionic species. For example, the porous electrically conductive layer preferably does not form an intermetallic phase and does not chemically react with the ionic species other than enabling electrochemical oxidation and reduction. Also, the porous electrically conductive layer preferably does not chemically interact with the ion-conducting layer, other than possible chemical bonding to adhere to the ion-conducting layer. Preferably, components of the first electrode do not form mobile ions with the ion-conducting layer.

The porous electrically conductive layer may be fabricated from common electrode materials including, but not limited to, Pt, Mo, W, Ni, Cu, Fe, and Al. In some embodiments, the porous electrically conductive layer includes additional layers, such as a Ti adhesion layer in addition to a Pt layer.

In some embodiments, the first electrode is a selectively permeable and electrically conductive structure, which may be a uniform layer or a non-uniform layer, for example. In these embodiments, the first electrode preferably has a high diffusivity for the metal atoms (e.g., alkali and/or alkaline earth metal atoms) that are in the atomic vapor whose density is to be controlled. The selected metal atoms preferably have a diffusion coefficient of at least about $10^{-10}$ m$^2$/s, more preferably at least about $10^{-6}$ cm$^2$/s, measured at the device-operation temperature, such as 25° C. In this patent application, "selectively permeable" refers to the transport of metal atoms through the electrode, by diffusion or conduction.

In embodiments employing a selectively permeable and electrically conductive layer or other structure, the first electrode may include an intercalation compound, or a material capable of forming an intercalation compound, with atoms in the atomic vapor whose density is being controlled. The intercalation compound may be graphite, MoS$_2$, TaS$_2$, or a combination thereof, for example.

The thickness of the selectively permeable and electrically conductive layer may be about 100 microns or less, such as about 50 microns or less, about 10 microns or less, or about 1 micron or less. In some embodiments, the thickness is less than about 100 nanometers, less than about 50 nanometers, or less than about 20 nanometers.

In some embodiments, the selectively permeable and electrically conductive layer of the first electrode contains particles of an intercalation compound in a matrix. The matrix may be a polymer binder, for example. The polymer binder may be selected for low outgassing and compatibility with ultra-high vacuum. In some embodiments, the polymer binder is selected from the group consisting of polyvinylpyrrolidone, fluoroelastomers, polyacrylates, cellulose resins, and combinations thereof. Additives may be included in the matrix, such as to increase the electrical conductivity. Such additives may be small conductive carbon particles, for example.

The first electrode may include regions and/or an additional layer with high electrical conductivity, to minimize sheet resistance of the first electrode. Exemplary materials for the highly electrically conductive layer are Pt, Mo, and W. For example, the first electrode may consist of two layers: a layer that is substantially graphite and a highly electrically conductive layer that is a porous mesh layer, such as a Pt mesh that is less than 100 nanometers in thickness. This configuration may allow the desirable property that, when applied, an electrical potential does not vary considerably (e.g. <0.1 V) across the first-electrode surface even if the intercalation material has mediocre electrical conductivity or the intercalation material is very thin. The highly electrically conductive layer may also itself contain multiple sub-layers, such as a Pt sub-layer and a Ti adhesion sub-layer. The highly electrically conductive layer preferably does not chemically interact with the ionic species, e.g. the layer does not form an intermetallic phase with the ionic species. Also, the highly electrically conductive layer preferably does not chemically interact with the ionic-conducting layer, e.g. the layer does not form mobile ions (such as $Pt^{2+}$) within the ionic-conducting layer.

In some embodiments, the first electrode is or includes a mixed ion-electron conductor, which is a uniform layer, non-uniform layer, or other structure that conducts both ions and electrons. A "mixed ion-electron conductor" or "MIEC" means a material having both electrical conductivity greater than $10^{-10}$ S/cm, preferably greater than $10^{-6}$ S/cm, and ionic conductivity greater than $10^{-10}$ S/cm, preferably greater than $10^{-6}$ S/cm.

In these embodiments, the first electrode may include various mixed ion-electron conductor materials. For example, the mixed ion-electron conductor material may be selected from the group consisting of alkali monoferrites (e.g. $RbFeO_2$, $CsFeO_2$, etc.), alkali monoaluminates (e.g. $RbAlO_2$, $CsAlO_2$, etc.), alkali monogallates (e.g. $RbGaO_2$, $CsGaO_2$, etc.), and combinations thereof. Any of these alkali monoferrites, alkali monoalluminates, or alkali monogallates are optionally doped with one or more atoms selected from Pb, Cd, Ca, P, V, Nb, Ta, Si, Ti, and/or Ge, for example. Exemplary compounds for the ion-electron conductor include, but are not limited to, $Rb_{1-2x}M_xAlO_2$ (x is from 0 to less than 0.5) wherein M=Pb, Cd, and/or Ca; $Rb_{2-2x}Fe_{2-x}M_xO_4$ (x is from 0 to 1) wherein M=P, V, Nb and/or Ta; $Rb_{2-2x}Ga_{2-x}M_xO_4$ (x is from 0 to 1) wherein M=P, V, Nb and/or Ta; $Rb_{2-2x}Al_{2-x}M_xO_4$ wherein M=P, V, Nb and/or Ta; and $Rb_{1-x}Al_{1-x}M_xO_2$ (x is from 0 to less than 1) wherein M=Si, Ti, and/or Ge.

In some embodiments, the mixed ion-electron conductor material may be selected from alkali pyrophosphates, such as $Rb_4P_2O_7$. The alkali pyrophosphate is optionally doped with one or more atoms selected from Ca, Sr, Ba, Pb, Y, La, and/or Nd, for example. Exemplary compounds for the mixed ion-electron conductor include, but are not limited to, $Rb_{4-2x}M_xP_2O_7$ (x is from 0 to less than 2) wherein M=Ca, Sr, Ba, and/or Pb; and $Rb_{3-3x}M_xPO_4$ (x is from 0 to less than 1) wherein M=Y, La, and/or Nd.

The thickness of the first electrode with MIEC is preferably less than 500 µm and more preferably less than 100 µm. In various embodiments, the thickness of the first electrode with MIEC is about 1 nm, 10 nm, 100 nm, 1 µm, 10 µm, 100 µm, 500 µm, or more.

The first electrode with MIEC may also comprise a region and/or layer with high electrical conductivity, to minimize electrical sheet resistance of the first electrode. For example, the first electrode may include two layers—a layer that is substantially a mixed ion-electron conductor and a layer that is a porous, highly electrically conductive layer. The highly electrically conductive layer preferably has an electrical resistivity less than $10^{-3}$ Ω·cm, and more preferably less than $10^{-4}$ Ω·cm, measured at 25° C. In various embodiments in which a porous, highly electrically conductive layer is present along with the MIEC, the electrical resistivity of the highly electrically conductive layer is about, or less than about, $10^{-2}$ Ω·cm, $10^{-3}$ Ω·cm, $10^{-4}$ Ω·cm, $10^{-5}$ Ω·cm, or $10^{-6}$ Ω·cm, measured at 25° C.

The optional porous, highly electrically conductive layer may be a thin (e.g., less than 200 nm) Pt mesh. This may allow the desirable property that an electrical potential, when applied, does not vary considerably (e.g., <0.1 V) across the electrode surface even if the MIEC material has mediocre electrical conductivity or if the MIEC material is very thin. Other exemplary materials for the optional porous, highly electrically conductive layer include, but are not limited to, Mo, W, and Al, and optionally elements such as Ti or V within an adhesion layer.

The optional highly electrically conductive layer preferably does not chemically interact with the ionic species and preferably does not form an intermetallic phase with the ionic species. The optional highly electrically conductive layer preferably does not chemically interact with the ion-conducting layer; portions of the first electrode should not form mobile ions within ion-conducting layer.

In various embodiments, the optional highly electrically conductive layer may be in contact with the ion-conducting layer, in contact with a vapor chamber volume, in contact with both the ion-conducting layer and a vapor chamber volume, or in contact with neither the ion-conducting layer nor the vapor chamber volume.

The first electrode with MIEC is preferably characterized by an electrical sheet resistance of less than about 10 MΩ/square, more preferably less than about 100 kΩ/square, and most preferably less than about 1 kΩ/square, measured at 25° C. The electrical resistivity of the first electrode with MIEC is preferably less than about 100 kΩ·cm, more preferably less than about 10 kΩ·cm, even more preferably less than about 0.1 kΩ·cm (100 Ω·cm), and most preferably less than about 0.01 kΩ·cm (10 Ω·cm) or 0.001 kΩ·cm (1 Ω·cm), measured at 25° C.

In some embodiments, the first electrode with MIEC is characterized by an ionic conductivity, for the same ionic species as is conducted in the ion-conducting layer, of at least about $10^{-12} Ω^{-1}·cm^{-1}$, more preferably at least about $10^{-9} Ω·cm^{-1}$, and most preferably at least about $10^{-6} Ω^{-1}·cm^{-1}$, measured at 25° C. The ionic conductance (through the electrode thickness) of the first electrode with MIEC is preferably less than about 10 kΩ, more preferably less than about 1 kΩ, and most preferably less than about 0.1 kΩ (100Ω), measured at 25° C.

In some embodiments, there are multiple first electrodes, such as 2, 3, 4, or more first electrodes. These first electrodes may also be referred to as front electrodes.

The second electrode is in contact with the ion-conducting layer and may be in contact with a vapor chamber volume.

The second electrode is electrically isolated from the first electrode, i.e. the second electrode is not in direct electrical contact with the first electrode. Electrical communication is possible through an external circuit. The first and second electrodes preferably are not electron-connected nor hole-connected, but are ion-connected, via the ion-conducting layer.

The second electrode is a multiphase electrode with at least an ion-conducting phase capable of transporting mobile ions (e.g., sodium cation $Na^+$) and an atom-transporting phase capable of storing and transporting neutral forms (e.g., elemental sodium $Na^0$) of mobile ions. Other phases may be present.

In this specification, neutral atoms include excited states of atoms (e.g., neutral sodium $Na^0$ may be present as excited sodium $Na^*$). An excited-state electron configuration of an atom occurs when a valence electron is promoted to a higher energy state, but the atom is still neutral unless an electron is lost or gained.

The atom-transporting phase of the second electrode stores and transports neutral atoms. Transport of neutral atoms is preferably via diffusion. At a fixed point in time, neutral atoms may be in the process of being transported into or out of the atom-transporting phase, may be stored at a fixed location within the atom-transporting phase, or may be moving within the atom-transporting phase but not across its phase boundary, and therefore stored within that phase. Transport of neutral atoms within the atom-transporting phase and/or across its phase boundaries may occur via various diffusion mechanisms, such as (but not limited to) bulk solid diffusion, porous diffusion, surface diffusion, grain boundary diffusion, permeation, solubility-diffusion, etc. Storage of neutral atoms is preferably via intercalation. Storage of neutral atoms also results when the diffusion rate of metal atoms is negligible (e.g., less than $10^{-10}$ $cm^2/s$).

In the atom-transporting phase of the second electrode, the selected metal atoms may have a diffusion coefficient of at least about $10^{-10}$ $cm^2/s$, $10^{-9}$ $cm^2/s$, $10^{-8}$ $cm^2/s$, $10^{-7}$ $cm^2/s$, $10^{-6}$ $cm^2/s$, or $10^{-5}$ $cm^2/s$, measured at the device-operation temperature, such as 25° C. The metal-atom diffusion in the second electrode as a whole will depend on the bulk diffusivity of the atom-transporting phase, the volume fraction of the atom-transporting phase, and the connectivity/tortuosity of atom-transporting phase.

The atomic species contained in the atom-transporting phase is preferably the reduced (neutral charge) form of at least one of the ionic species contained in the ion-conducting layer. Alternatively, or additionally, the atom-transporting phase may contain an atomic species that is different than the species contained in the ion-conducting layer. For example, when the device is configured to source atoms, Na may be contained within the atom-transporting phase, Na may be oxidized to $Na^+$ at the second electrode, $Rb^+$ may be reduced to Rb at the first electrode, and the ion-conducting layer may contain both $Na^+$ and $Rb^+$.

The atom-transporting phase preferably contains an intercalable compound that is capable of being intercalated by at least one element in ionic and/or neutral form. As used herein, an "intercalable compound" (or "intercalatable compound") is a host material that is capable of forming an intercalation compound with guest atoms which comprise the atomic vapor whose density is being controlled. Stated another way, the intercalable compound is intercalative for (capable of intercalating) at least some of the atoms in the atomic vapor. The guest atoms that are intercalated may be neutral atoms, ionic species, or a combination thereof. Typically, the guest atoms are intercalated as neutral atoms.

In some embodiments, the host material actually contains the guest species, resulting in a material which may be referred to as an "intercalation compound." It is noted that for the purposes of this patent application, any reference to intercalable compound may be replaced by intercalation compound, and vice-versa, since an intercalable compound must be capable of intercalating a guest species but may or may not actually contain the intercalated guest species.

"Intercalation" herein is not limited to the reversible inclusion or insertion of an atom, ion, or molecule sandwiched between layers present in a compound, which shall be referred to herein as "layer intercalation." Intercalation also includes absorption of neutral atoms or ionic species into a bulk phase of the compound, whether that phase is amorphous or crystalline; adsorption of neutral atoms or ionic species onto an outer surface or an internal surface (e.g., a phase boundary) present in the compound; and reversible chemical bonding between the neutral atoms or ionic species, and the compound.

Some embodiments of the invention utilize layer intercalation, in which a guest species such as K expands the van der Waals gap between sheets of a layered compound such as graphite. This layer expansion requires energy. Without being limited by theory, the energy may be supplied by electrical current to initiate charge transfer between the guest (e.g., K) and the host solid (e.g., graphite). In this example, potassium graphite compounds such as $KC_8$ and $KC_{24}$ may be formed. These compounds are reversible, so that when the electrical current is adjusted, the potassium graphite compounds may give up the intercalated atoms (K). Those previously intercalated atoms may be released into the vapor phase or into the ion-conducting layer, for example. Electrical energy may be supplied to cause a chemical potential change at the interface with the intercalable compound, which then causes layer expansion.

In some embodiments, the intercalable compound is a carbonaceous material, such as a material selected from the group consisting of graphite, graphite oxide, graphene, graphene oxide, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

The intercalable carbonaceous material may be at least 50 wt % carbon, preferably at least 75 wt % carbon, more preferably at least 90 wt % carbon, most preferably at least 95 wt % carbon. In some embodiments, the carbonaceous material is essentially pure carbon, except for impurities. The carbonaceous material may include mesoporous carbon, microporous carbon, nanoporous carbon, or a combination thereof.

The intercalable carbonaceous material may be a form of predominately $sp^2$ bonded carbon. Examples of $sp^2$ bonded carbon include, but are not limited to, graphite, graphene, carbon nanotubes, carbon fibers, fullerenes (e.g. $C_{60}$ or $C_{70}$), pyrolyzed carbon-containing molecules or polymers (such as pyrolyzed parylene, e.g. parylene-N, parylene-C, or parylene-AF-4), and large polyaromatic hydrocarbons (e.g. pentacene, rubrene, hexabenzocoronene, or coronene). In the case of graphene (which is essentially a single layer of graphite), the graphene may be monolayer graphene or multiple layers of graphene. Graphene flakes (a few layers of graphene) may be utilized. Certain embodiments utilize monolayer holey graphene, multiple layers of holey graphene, or graphene platelets.

In certain embodiments, the carbonaceous material comprises graphite. Graphite consists of planes of carbon sheets. Metal atoms, especially alkali atoms, readily intercalate between these carbon sheets, leading to a high diffusivity for those atoms. Graphite electrodes enable fast metal transport at low voltages and low power consumption per atom removed. Graphite not only transports atoms via intercalation, but also is electrically conductive due to the electron delocalization within the carbon layers. Valence electrons in the carbon are free to move, thereby conducting electricity through the graphite.

The graphite may be natural graphite (e.g., mined graphite) or synthetic graphite produced from various techniques. For example, graphite may be obtained from chemical-vapor-deposited graphitic carbon, carbide-derived graphite, recycled graphite, waste from graphene manufacture, and so on. Crystalline flake graphite occurs as isolated, flat, plate-like particles with hexagonal edges if unbroken; when broken the edges can be irregular or angular. Amorphous graphite is very fine flake graphite. Lump graphite occurs in fissure veins or fractures and appears as massive platy intergrowths of fibrous or acicular crystalline aggregates. Highly oriented pyrolytic graphite is graphite with an angular spread between the graphite sheets of less than 1°.

The graphite may be crystalline, amorphous, or a combination thereof. The graphite crystallinity may range from about 10% to about 90%, for example. A mixture of crystalline and amorphous graphite may be beneficial for intercalation not only between crystal layers but also between crystalline and amorphous regions of the graphite. With too much crystallinity, the diffusivity becomes highly anisotropic. If highly crystalline (i.e. highly anisotropic) graphite is oriented with the low-diffusivity axis normal to the surface of the device (which is a typical orientation), reduced alkali flux, and thus reduced performance, would result.

In some embodiments, the intercalable compound of the atom-transporting phase is a transition-metal oxide, a transition-metal dichalcogenide, or a combination thereof. The intercalable compound may also be a mixture of a carbonaceous material and a transition-metal oxide, or a mixture of a carbonaceous material and a transition-metal dichalcogenide, or a mixture of all of these materials. Specifically, the intercalable compound may be a metal dichalcogenide selected from $MoS_2$, $TaS_2$, $TiTe_2$, or any other transition metal dioxide, disulfide, diselenide, or ditelluride.

Figure 2:
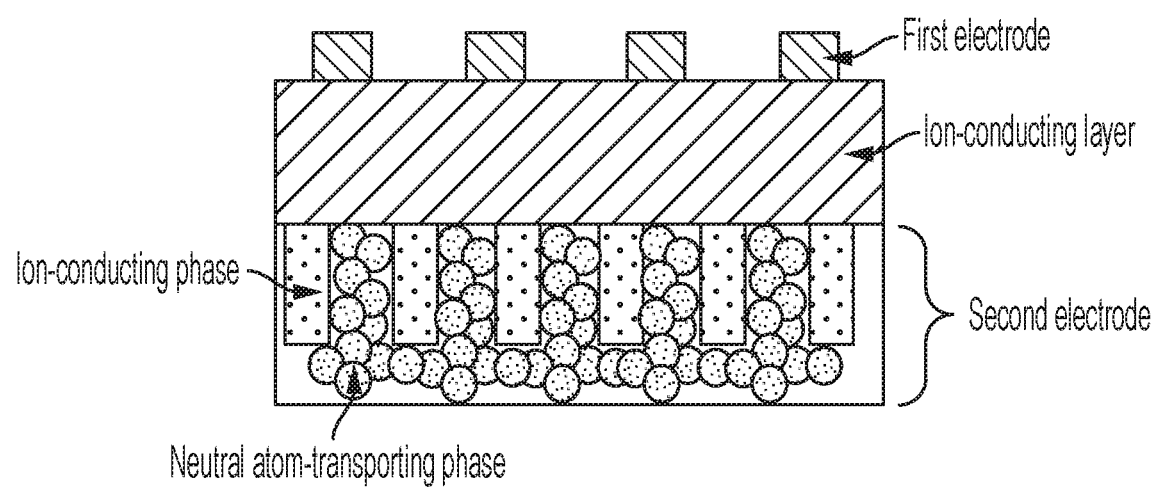
FIG. 2 is a schematic illustration of a metal vapor-density control system in which the ion-conducting phase is structurally integrated with a side of the ion-conducting layer, forming pillars of ion-conducting phase, and the neutral atom-transporting phase in the second electrode is a plurality of particles.
Figure 3:
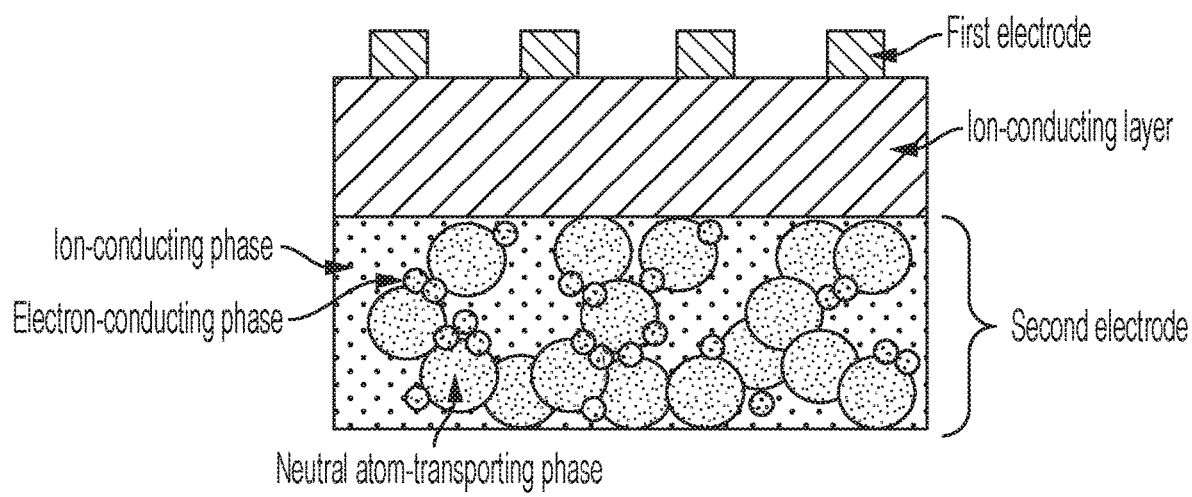
FIG. 3 is a schematic illustration of a metal vapor-density control system in which the neutral atom-transporting phase in the second electrode is a plurality of particles, and the ion-conducting phase in the second electrode is a matrix around the particles of the atom-transporting phase.

The atom-transporting phase preferably is in the form of distinct particles, such as depicted in FIGS. 1 to 3. The atom-transporting phase particles may have an average minimum dimension (e.g., diameter or effective diameter) less than about 1 millimeter, 500 microns, 100 microns, 50 microns, 10 microns, 5 microns, 1 micron, or 500 nanometers. In some embodiments, the atom-transporting phase particles have an average minimum dimension from about 100 nanometers to about 20 microns. Lower dimensions reduce the diffusion length for the neutral atoms, thus improving their transport rate. Particle sizes may be measured by a variety of techniques, including dynamic light scattering, laser diffraction, image analysis, or sieve separation, for example.

Figure 4:
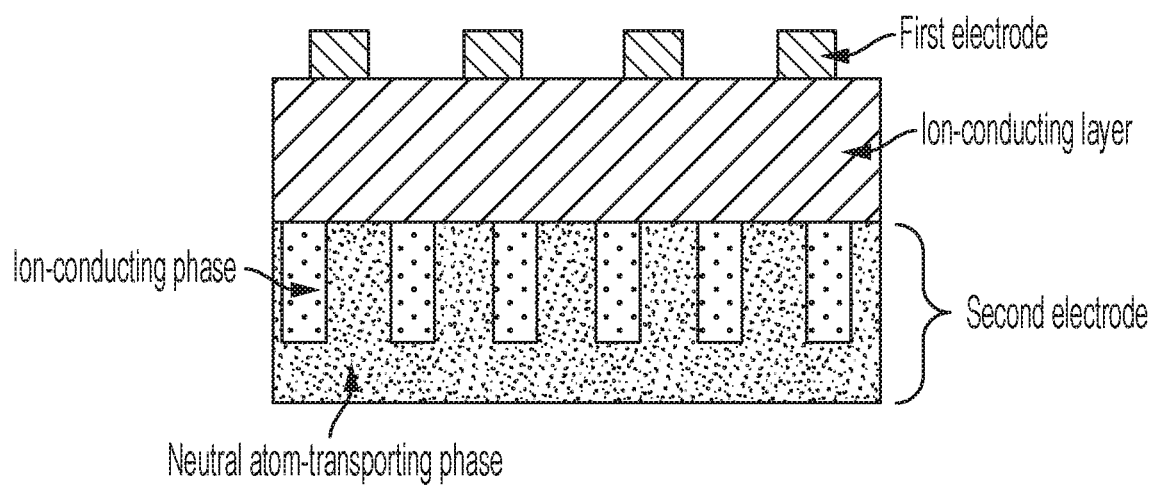
FIG. 4 is a schematic illustration of a metal vapor-density control system in which the ion-conducting phase is structurally integrated with a side of the ion-conducting layer, and the neutral atom-transporting phase fills the regions between the pillars of ion-conducting phase.
Figure 5:
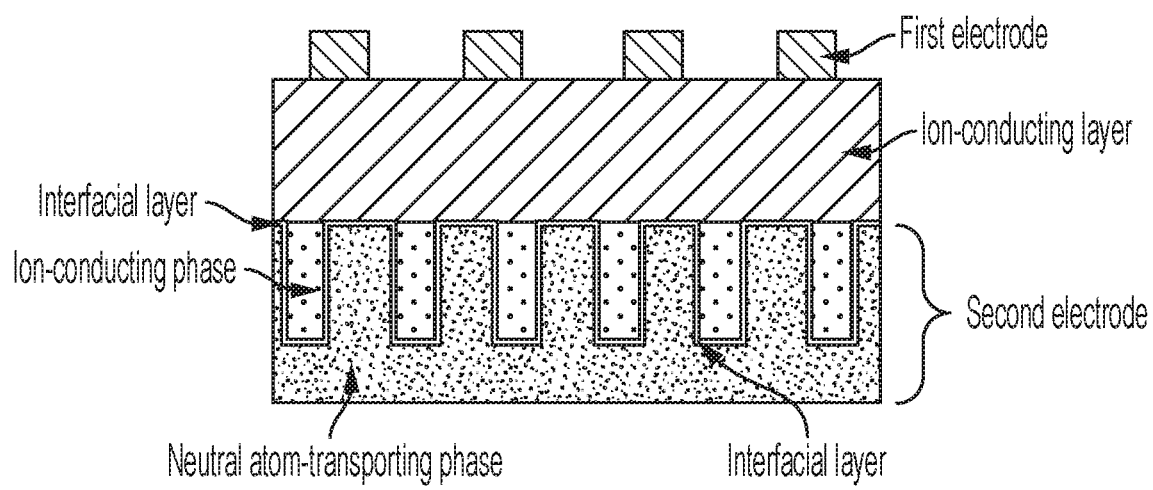
FIG. 5 is a schematic illustration of a metal vapor-density control system in which the ion-conducting phase is structurally integrated with a side of the ion-conducting layer, the neutral atom-transporting phase fills the regions between the pillars of ion-conducting phase, and there is an interfacial layer between the ion-conducting phase and the neutral atom-transporting phase.

In alternative embodiments, the atom-transporting phase is in the form of a continuous or semi-continuous phase, such as depicted in FIGS. 4 and 5. For example, the atom-transporting phase may be a continuous or semi-continuous phase fabricated from a carbon aerogel, a carbonized polymer, or a reticulated vitreous carbon foam.

The ion-conducting phase of the second electrode conducts or otherwise transports ions (positively or negatively charged atoms). The ion-conducting phase may be a different structural element than the ion-conducting layer, or may be an integrated structural element (see FIGS. 1 to 5). The ion-conducting layer and ion-conducting phase (within second electrode) collectively form ion-conducting regions of the system. The materials employed for these ion-conducting regions are preferably the same, but that is not necessary.

The ion-conducting phase preferably has high ionic conductivity for a selected ionic species. Typically, the selected ionic species is an ion of the atomic vapor whose density is to be controlled by the system. The selected ionic species is preferably (but is not limited to) one or more of $Li^+$, $Na^+$, $K^+$, $Rb^+$, $Cs^+$, $Sr^{2+}$, $Ca^{2+}$ or $Yb^3$. In certain embodiments, the ionic species is an ion of another metal, such as $Hg^{2+}$.

The ionic conductivity of the ion-conducting phase, measured at 25° C., is preferably about $10^{-9}$ S/cm or higher, more preferably about $10^{-6}$ S/cm or higher, for a selected ionic species. In various embodiments, the ionic conductivity of the ion-conducting phase at 25° C. is about $10^{-8}$ S/cm, $10^{-7}$ S/cm, $10^{-6}$ S/cm, $10^{-5}$ S/cm, $10^{-4}$ S/cm, $10^{-3}$ S/cm, or $10^{-2}$ S/cm. Note that the ionic conductivity of the second electrode as a whole will depend on the bulk ionic conductivity of the ion-conducting phase, the volume fraction of the ion-conducting phase, and the connectivity/tortuosity of the ion conducting phase.

The ion-conducting phase preferably includes a solid electrolyte. For example, the ion-conducting phase may be a large fraction (>50% by weight) β-alumina, β"-alumina, or a combination of β-alumina and β"-alumina. β-alumina and β"-alumina are good conductors of their mobile ions yet allows negligible non-ionic (i.e., electronic) conductivity. β"-alumina is a hard polycrystalline or monocrystalline ceramic which, when prepared as an electrolyte, is complexed with a mobile ion, such as $Na^+$, $K^+$, or $Li^+$. β-alumina and/or β"-alumina are also referred to herein as "beta-alumina." Beta-alumina solid electrolyte is a fast ion-conductor material used as a membrane in several types of electrochemical cells. Other possible solid electrolyte materials for the ion-conducting phase include yttria-stabilized zirconia, NASICON, LISICON, KSICON, alkali-ion-exchanged versions thereof, and combinations of any of the foregoing. In these or other embodiments, chalcogenide glasses may be used as solid electrolyte materials for the ion-conducting phase. Exemplary chalcogenide glasses include, but are not limited to, $RbI$—$GeSe_2$—$Ga_2Ge_3$ and $CsI$—$GeSe_2$—$Ga_2Ge_3$.

The ion-conducting phase may be in the form of distinct particles, such as depicted in FIG. 1. The ion-conducting phase particles may be generated by ball milling, cryomilling, or other techniques for making particles. The ion-conducting phase particles may have an average minimum dimension (e.g., diameter or effective diameter) less than about 1 millimeter, 500 microns, 100 microns, 50 microns, 10 microns, 5 microns, or 1 micron. Lower dimensions reduce the conduction length for the ions, improving their transport rate if mass transfer is limited by ion flux.

Alternatively, the ion-conducting phase may be in the form of a continuous or semi-continuous phase, such as depicted in FIG. 3. In these embodiments, the ion-conducting phase may be fabricated from a sol-gel solution around particles of the atom-transporting phase, for example.

In some embodiments, the ion-conducting phase is in the form of structurally integrated features on a surface of the ion-conducting layer, such as depicted in FIGS. 2, 4, and 5. In these embodiments, a surface of the ion-conducting layer on the opposite side as the first electrode may be chemically etched, plasma etched, and/or mechanically machined to form trenches, posts, pillars, scaffolding, stochastic surface roughness, or other features. The features contain the ion-conducting phase and may be chemically and/or physically continuous with the ion-conducting layer. In certain embodiments, pillars or ridges are machined into the back of the ion-conducting layer to form the ion-conducting phase of the second electrode. Typically, the material of the ion-conducting phase is the same as the material of the ion-conducting layer. The ion-conducting phase may have an electrical conductivity of at least 0.1 S/cm measured at 25° C.

Alternatively, or additionally, the second electrode may further contain an electron-conducting phase with an electrical conductivity of at least 0.1 S/cm measured at 25° C. In these embodiments, the electron-conducting phase is physically distinct from the ion-conducting phase and the atom-transporting phase. Generally speaking, a separate electron-conducting phase is included (e.g., FIGS. 1 and 3) when the ion-conducting phase and/or the atom-transporting phase do not have sufficient electrical conductivity. The electron-conducting phase may be fabricated from Pt, Cu, Mo, W, Ni, Cu, Fe, Al, or combinations thereof, for example. The electron-conducting phase may be in the form of distinct particles, such as depicted in FIGS. 1 and 3, or strips, whiskers, or other geometries. Conductive particles, such as carbon particles, may be included in the electron-conducting phase, wherein the conductive particles are separate from the electron-conducting phase particles, or are present as smaller particles within each of the electron-conducting phase particles. In various embodiments, the electrical conductivity of the electron-conducting phase is about, or at least about, 0.1, 0.5, 1, 10, 50, 100, 500, 1000, 2000, 5000, 10000, 20000, 30000, 40000, 50000, or 60000 S/cm, for example. Note that the electrical conductivity of the second electrode as a whole will depend on the bulk electrical conductivity of the electron-conducting phase, the volume fraction of the electron-conducting phase, and the connectivity/tortuosity of the electron-conducting phase.

Within the second electrode, there is preferably a high interfacial area density between the atom-transporting phase and the ion-conducting phase. In some embodiments, there is an interfacial area density of at least 10 mm$^2$/mm$^3$, preferably at least 100 mm$^2$/mm$^3$, and most preferably at least 1000 mm$^2$/mm$^3$ between the atom-transporting phase and the ion-conducting phase. In preferred embodiments, the interfacial area density is at least 200 mm$^2$/mm$^3$. A high interfacial area increases the overall transport rate of metal species between the atom-transporting phase and the ion-conducting phase.

The atom-transporting phase and the ion-conducting phase may be held together with a binder, such as a polymer binder. The polymer binder may be selected for low out-gassing and compatibility with ultra-high vacuum. In some embodiments, the polymer binder is selected from the group consisting of polyvinylpyrrolidone, fluoroelastomers, polyacrylates, cellulose resins, and combinations thereof. The binder may be introduced along with a solvent and then the solvent driven off, such as via evaporation, during fabrication of the system.

In some embodiments, there is an interfacial layer between the atom-transporting phase and the ion-conducting phase. An example of this configuration is depicted in FIG. 5. The interfacial layer may facilitate high transports rates by having lower interfacial resistance than if the atom-transporting phase and the ion-conducting phase were in direct contact. The interfacial layer may improve wetting during sintering, in some embodiments of device fabrication. Also, the interfacial layer may improve device reliability and longevity by increasing interface stability, such as by preventing the formation of dendrites or other undesirable byproducts. The interfacial layer may be fabricated from metals, metal alloys, metal oxides, metal carbonates, mixed metal carbonates, carbon, or pyrolyzed polymers, for example.

The multiphase second electrode may be fabricated in a number of different ways. In some embodiments, particles (e.g., ball-milled powders) of all phases may be mixed, pressed, and optionally sintered. In other embodiments, a porous structure of a subset of the phases may be formed and then a liquid precursor of the remaining phase(s) may be infiltrated into the porous structure and chemically reacted into the remaining phase(s). The porous structure may be formed by subtractive means such as chemical etching, electrochemical etching, photo-electrochemical etching, plasma etching, or ion milling, for example, such as deep reactive ion etching through a lithographically defined mask. The porous structure may be formed by additive means such as sintering of particles, additive manufacturing, or welding, for example. In some embodiments, a porous structure of a subset of the phases may be formed and then the remaining phase(s) may be deposited with vapor deposition, such as chemical vapor deposition, atomic layer deposition, evaporation, or sputtering, for example. In some embodiments, a porous structure of a subset of the phases may be formed and then the remaining phase(s) may be deposited with liquid phase chemistry, such as sol-gel chemistry, for example.

The second electrode overall may be a uniform layer or structure, or a non-uniform layer or structure. The thickness of the second electrode may be less than 500 µm or less than 100 µm. In various embodiments, the thickness of the second electrode is about 1, 5, 10, 20, 30, 40, 50, 75, 100, 200, or 500 µm.

In some embodiments, there are multiple second electrodes, such as 2, 3, 4, or more second electrodes. These second electrodes may also be referred to as back electrodes.

Each electrode is typically connected to an electrical lead fabricated from an electrically conductive material. A lead is an electrical connection consisting of a length of wire, metal pad, metal trace, or other electrically conductive structure. Leads are used to transfer power and may also provide physical support and potentially provide a heat sink. In some embodiments, a device is provided without such leads, which may be added at a later time, before use.

The ion-conducting layer is between the first and second electrodes. The ion-conducting layer preferably has high ionic conductivity for a selected ionic species. Typically, the selected ionic species is an ion of the atomic vapor whose density is to be controlled by the system. The selected ionic species is preferably (but is not limited to) one or more of Li$^+$, Na$^+$, K$^+$, Rb$^+$, Cs$^+$, Sr$^{2+}$, Ca$^{2+}$ or Yb$^{3+}$. In certain embodiments, the ionic species is an ion of another metal, such as Hg$^{2+}$.

The ionic conductivity of the ion-conducting layer, measured at 25° C., is preferably about 10$^{-9}$ S/cm or higher, more preferably about 10$^{-6}$ S/cm or higher, for a selected ionic species. In various embodiments, the ionic conductivity of the ion-conducting layer at 25° C. is about 10$^{-8}$ S/cm, 10$^{-7}$ S/cm, 10$^{-6}$ S/cm, 10$^{-5}$ S/cm, 10$^{-4}$ S/cm, 10$^{-3}$ S/cm, or 10$^{-2}$ S/cm.

The ion-conducting layer is preferably a solid electrolyte. For example, the ion-conducting layer may be a large fraction (>50% by weight) β-alumina, β"-alumina, or a combination of β-alumina and β"-alumina. Other possible solid electrolyte materials for the ion-conducting layer include yttria-stabilized zirconia, NASICON, LISICON, KSICON, alkali-ion-exchanged versions thereof, and combinations of any of the foregoing. In these or other embodiments, chalcogenide glasses may be used as solid electrolyte materials for the ion-conducting layer. Exemplary chalcogenide glasses include, but are not limited to, $RbI-GeSe_2-Ga_2-Ge_3$ and $CsI-GeSe_2-Ga_2Ge_3$.

Some variations of the invention can be further understood by reference to the drawings, which are exemplary and not intended to limit the scope of the invention. The drawings are not drawn to scale. FIGS. 1 to 5 are two-dimensional side views of a metal vapor-density control system, or a portion thereof. The regions and layers of FIGS. 1 to 5 may be repeated or extended in any dimension. For example, in FIG. 1, additional regions of first electrode may be present. Also, in FIG. 1 to 5, other regions, layers, and additives may be present, and the depicted structure may be part of a larger metal vapor-density control system.

FIG. 1 is a schematic illustration of a metal vapor-density control system in which particles of the ion-conducting phase, the electron-conducting phase, and the neutral atom-transporting phase of the second electrode are sintered or otherwise bound together.

FIG. 2 is a schematic illustration of a metal vapor-density control system in which the ion-conducting phase is structurally integrated with a side of the ion-conducting layer, forming pillars of ion-conducting phase. In some embodiments, the ion-conducting phase is a series of etched ridges of the ion-conducting layer, in which case the materials are typically the same. The neutral atom-transporting phase in the second electrode is a plurality of particles.

FIG. 3 is a schematic illustration of a metal vapor-density control system in which the neutral atom-transporting phase in the second electrode is a plurality of particles, and the ion-conducting phase in the second electrode is a matrix (obtained e.g. via sol-gel chemistry) around the particles of the atom-transporting phase.

FIG. 4 is a schematic illustration of a metal vapor-density control system in which the ion-conducting phase is structurally integrated with a side of the ion-conducting layer. In some embodiments, the ion-conducting phase is a series of etched ridges of the ion-conducting layer, in which case the materials are typically the same. The neutral atom-transporting phase fills the regions between the pillars of ion-conducting phase. The atom-transporting phase may be formed by pyrolysis of a vapor-deposited polymer or liquid-deposited polymer, for example.

FIG. 5 is a schematic illustration of a metal vapor-density control system in which the ion-conducting phase is structurally integrated with a side of the ion-conducting layer. In some embodiments, the ion-conducting phase is a series of etched ridges of the ion-conducting layer, in which case the materials are typically the same. The neutral atom-transporting phase fills the regions between the pillars of ion-conducting phase. In FIG. 5, there is an interfacial layer between the ion-conducting phase and the neutral atom-transporting phase. The atom-transporting phase may be formed by pyrolysis of a vapor-deposited polymer or liquid-deposited polymer, following formation of the interfacial layer, for example.

A number of variations of the metal vapor-density control system are possible.

The metal vapor-density control system may be part of a device that includes a vapor chamber volume. The vapor chamber volume is in contact with the first electrode and preferably in contact with the ion-conducting layer. The vapor chamber contains an atomic vapor, such as a vapor of an alkali metal or an alkaline earth metal, or another atomic metal, such as a rare earth metal (e.g., Yb, Ce, Nd, Sc, or Y) or mercury. The atomic vapor may be isotopically enriched or purified. The vapor chamber be under partial vacuum and contain nothing in addition to the atomic vapor. In some embodiments, the vapor chamber contains additional gases, such as $N_2$, $CH_4$, He, Ar, Ne, Xe, or $NH_3$. The additional gases may be used as a buffer gas or as spin exchange gas, for example. The additional gases may be isotopically enriched or purified.

The vapor chamber may be hermetically sealed or may be in fluid communication with a larger system (e.g. part of a high-vacuum system containing e.g. pumps, pressure/vacuum gauges, atom dispensers, getters, getter pumps, etc.).

One or more walls of the vapor chamber volume may be substantially transparent at relevant wavelengths such that there is an optical path through the vapor cell volume. In some embodiments, there are three orthogonal optical paths to facilitate the formation of a magneto-optical trap (MOT) and atomic cloud imaging. The optical paths do not need to be orthogonal when entering a vapor cell. For example, there could be mirrors inside the vapor cell that make them orthogonal only inside the vapor cell. There could be one optical path entering the cell, which optical path is split within the vapor cell. In some embodiments, within the vapor cell, along three different orthogonal axes based on the location of trapped atoms, two optical paths (one in each direction) are located on each of the three axes.

An "optical path" is the path of a spectroscopic probing beam of light (or other type of laser beam) into a vapor-cell region. The optical path is optional in the sense that the device itself does not inherently include the beam of light, while operation of a device (in some embodiments) at least periodically means that an optical path is traversing into or through the vapor-cell region. Also note that an optical path is not necessarily a straight line. Internal reflectors may be included in the system, so that optical reflection occurs. In that case, the optical beam could enter and exit along the same wall (detection probe on the same side as the laser source), for example.

It shall be understood that laser beams may or may not be present in any vapor cell described in this specification. That is, a source of laser beams may be present but not operating, in which case no laser beams will enter or be present within the vapor-cell region. Or a vapor cell may be provided without a source of laser beams, which source may be added at a later time, prior to operation of the vapor-cell system. Likewise, magnetic field sources (external to the device) and magnetic field lines (within the device) are not depicted in the drawings, because magnetic field sources and lines may or may not be actually present.

The metal vapor-density control system, or a device containing such control system, may include an atom reservoir that is distinct from the atom-transporting phase of the second electrode. The reservoir volume may contain metal in the vapor phase and possibly in solid and/or liquid phases as well. The atomic species contained within the atom reservoir is preferably the reduced form of the same ionic species as in the ion-conducting layer. Alternatively, a different atomic species may be contained within the reservoir. For example, when the device is sourcing atoms, Na may be contained within the reservoir and be oxidized at the second electrode, while Rb may be reduced at the first electrode.

The atom reservoir has walls that are preferably impermeable to the atomic species contained inside the reservoir. The walls are preferably thin films and supported by a substrate (e.g. glass, Si, alumina, etc.). The side(s) of the reservoir walls that face the interior of the reservoir preferably do not chemically interact with the ionic species. For example, the reservoir walls do not form an intermetallic phase with the ionic species and do not chemically react with the ionic species. Exemplary reservoir wall materials include Pt, Mo, W, or a combination thereof, for the walls that face the interior of the reservoir. When there are side(s) of the reservoir walls that touch the ionic-conducting layer, the reservoir walls preferably do not chemically interact with the ionic-conducting layer, other than chemical bonding to adhere to the ion-conducting layer. For example, portions of the electrode do not form mobile ions within the ion-conducting layer. Exemplary reservoir wall materials include Pt, Mo, W, or a combination thereof, for the walls (if any) that touch the ionic-conducting layer.

The atom reservoir is preferably in contact with the second electrode. The atom reservoir may be integrated with the second electrode. For example, the atom reservoir may be comprised, in part or in whole, by graphite or graphitic carbon. The graphite or graphitic carbon provides electrical conductivity and also a means of storing atoms, such as in a graphite intercalation compound.

The atom reservoir is preferably designed to accommodate any mechanical strain from a changing reservoir volume due to the loss or introduction of atoms. For instance, a gap may be situated between an intercalation compound and the reservoir walls to permit expansion of the intercalation compound without straining the reservoir walls. The reservoir walls may be designed to elastically and/or plastically deform. This configuration may be accomplished through material selection (e.g. metals, polymers, or a combination thereof). Alternatively, or additionally, this configuration may be accomplished through reservoir design (e.g. a bellows).

Multiple ion-conducting layers, each with their own electrodes, may be present in a single device. Multiple first electrodes may or may not be electrically connected through electrical leads or electrical traces. Likewise, multiple second electrodes may or may not be electrically connected through electrical leads or electrical traces.

Multiple sets of first electrodes, ion-conducting layers, and second electrodes may generally be present. In some embodiments, two or more first (front) electrodes are employed. In these or other embodiments, two or more second (back) electrodes are employed. In any of these embodiments, or other embodiments, two or more ion-conducting layers are employed.

There are many options for the electrical connections to the first and second electrodes of the metal vapor-density control system. The electrical connections may be connected to bond pads for connection to an external circuit. The electrical connections may include through-wafer vias, patterned electrically conductive thin films, doped regions of semiconductors, wire bonds, or a combination thereof. Patterned thin films may be parallel with the first electrode, such as when the first electrode is substantially flat. Parts of patterned thin films may be at an angle with the first electrode. In some embodiments, the electrode connections travel out of the plane of the electrode to which it is connected.

The metal vapor-density control system may be part of a device that includes an integrated heater. The integrated heater may be a resistive heater, such as a thin wire or a patterned thin metal trace (e.g. Pt or nickel-chromium alloy). The integrated heater may also be a radiative heater or a thermoelectric heater, for example. The integrated heater preferably includes a temperature sensor, such as a thermocouple or a resistance temperature detector (e.g., Pt).

When an integrated heater is included in the device, the heater may further comprise one or more thermal isolation structures. A thermal isolation structure minimizes heat transfer from the heated region of the device to the colder, ambient environment. A thermal isolation structure is configured to minimize heat loss out of the heated region into a cold region, by functioning as insulation to retain heat within the heated region. The thermal isolation structure preferably has a high value of thermal resistance, as further explained below.

A thermal isolation structure may be made of the same material and layer as the atom reservoir walls, in some embodiments. In these or other embodiments, a thermal isolation structure may be made of the same material and layer as the ion-conducting layer. The thermal isolation structure is preferably polymer, ceramic, or glass, although metal may be utilized as well, or a combination of the foregoing.

In some embodiments, the thermal isolation structure is fabricated from a material selected from the group consisting of β-alumina (e.g., Rb-β-alumina, Na-β-alumina, or Sr-β-alumina), β"-alumina (e.g., Rb-β"-alumina, Na-β"-alumina, or Sr-β"-alumina), α-alumina, silica, fused silica, quartz, borosilicate glass, silicon, silicon nitride, silicon carbide, and combinations thereof.

The thermal isolation structure may be designed to accommodate materials with any thermal conductivity. High-thermal-conductivity materials will benefit from long, high-aspect ratio connections, while lower-thermal-conductivity materials may utilize shorter, stubbier connections.

An important design parameter for the thermal isolation structure (when present) is the thermal resistance. The thermal resistance is the temperature difference across the thermal isolation structure when a unit of heat energy flows through it in unit time; or equivalently, the temperature difference, at steady state, between two defined surfaces of the thermal isolation structure that induces a unit heat flow rate. Because the desire is for a low heat flow rate, a high temperature difference is desired, i.e., a high value of thermal resistance. The thermal resistance of a thermal isolation structure is preferably at least 100 K/W, more preferably at least 1,000 K/W, and most preferably at least 10,000 K/W.

A thermal isolation structure may also be configured to impart mechanical strain relief, thereby preventing mechanical damage due to thermal strains that build up when the ionic conductor is heated to a higher temperature than the base substrate. In some embodiments, a thermal isolation structure is mechanically connected to a base substrate, for example through a frame. Preferably, the thermal isolation structure is designed to reduce thermal stress or residual stress by at least 2×, preferably at least 10×, and more preferably at least 100× from one side of the thermal isolation structure to the other side. The thermal or residual stress reduction is not an inherent material property, but is a function of the geometric design of the thermal isolation structure and its material properties.

In some embodiments, a thermal isolation structure is a suspension beam. Typically, a plurality of suspension beams will be present to connect the heated region to the cold region. The heated region only contacts the cold region through the suspension beams. The suspension beams may be straight beams, folded beams, tortuous beams, circular beams, and so on. The suspension beams may be made in any one (or more) layers in a planar process, such as surface or bulk micromachining. The rest of the heated region may be surrounded by vacuum or a vapor phase (e.g., containing an inert gas), either of which has a high thermal resistance to the cold region. As an alternative, the vapor/vacuum region may include a thermal insulator material, such as an aerogel.

In some embodiments, a thermal isolation structure has a thin metal film patterned on it for electrical interconnections. In some preferred embodiments, a resistive heater and a temperature sensor are patterned on (in contact with) the same layer as at least one thermal isolation structure. Preferably, electrical connections to the heater and the temperature sensor are also patterned on one or more thermal isolation structures. Optionally, part or all of the heater may be patterned on a thermal isolation structure or on multiple thermal isolation structures. In some embodiments, a thin film resistive heater is patterned on one or more sides of the same layer as a thermal isolation structure. In cases where the ion-conducting layer is separate from the thermal isolation structure, the heater may be patterned on the same side or the opposite side of the thermal isolation structure compared to the position of the ion-conducting layer. In cases where the ion-conducting layer is the same as a thermal isolation structure, or a layer thereof, the heater may be patterned on either side of the ion-conducting layer (i.e. on the first-electrode side and/or on the second-electrode side). See commonly owned U.S. patent application Ser. No. 16/573,684, filed on Sep. 17, 2019, which is hereby incorporated by reference herein.

The integration of the heater and thermal isolation structures within the system enables low system power input. The system power input for controlling vapor density of metal atoms is preferably less than about 500 mW, more preferably less than about 200 mW, and most preferably less than about 100 mW. In various embodiments, the system power input for sourcing and/or sinking metal atoms is about 1000, 500, 400, 300, 200, 100, 50, 25, or 10 mW.

In some embodiments in which high vapor density is desirable, the density of metal atoms may be at least $10^9$ atoms per cm$^3$, preferably at least $10^{10}$ per cm$^3$, and more preferably at least $10^{11}$ per cm$^3$. In some embodiments in which low vapor density is desirable, the density of metal atoms may be below $10^8$ atoms per cm$^3$, preferably below $10^7$ atoms per cm$^3$. In various embodiments, the density of metal atoms if about, at least about, or at most about $10^6$ atoms per cm$^3$, $10^7$ atoms per cm$^3$, $10^8$ atoms per cm$^3$, $10^9$ atoms per cm$^3$, $10^{10}$ atoms per cm$^3$, $10^{11}$ atoms per cm$^3$, or $10^{12}$ atoms per cm$^3$.

A vapor cell may be situated inside a magnetic field. Coils of wire driven in an anti-Helmholtz configuration surrounding the vapor cell can be used to generate magnetic fields required for a trap. Other magnetic-field sources (such as magnets or materials capable of generating magnetic flux) may be utilized to generate magnetic fields within a vapor-cell region.

A vapor cell may be contained within an oven. The purpose of the oven may be to control the temperature of the vapor cell at a temperature above the ambient temperature, for example. In principle, a vapor cell may be contained within any sort of temperature-controlled system, for heating or cooling the vapor cell.

The metal vapor-density control system may be implemented at a wide variety of length scales. The length scale may be characterized by the square root of the first electrode area. This length scale may vary from 10 m to 1 micron, with 1 m to 10 mm being typical for macroscale atomic timing and navigation systems, and 10 mm to 10 microns being typical for chip-scale atomic timing and navigation systems.

Chip-scale devices are preferably constructed using microfabrication techniques, including some or all of lithography, evaporation, shadow-masking, evaporation, sputtering, wafer bonding, die bonding, anodic bonding, glass frit bonding, metal-metal bonding, and etching.

The metal vapor-density control system, or a device containing the system, may also contain an atom chip for intra-system generation of magnetic fields for microtraps. Combining the metal vapor-density control system with an atom chip provides for device miniaturization.

The atom chip and the ion-conducting layer need not be the same size. An atom chip may be disposed on a different vapor cell face from the ion-conducting layer. An atom chip may be fabricated on a base chip that is heterogeneously integrated with the ion-conducting layer on the same vapor cell face. The atom chip may be closer to the vapor cell volume than the ion-conducting layer, in which case the vapor atoms may pass around the edges of the atom chip or through one of more holes in the atom chip, for example. The ion-conducting layer may be closer to the vapor cell than the atom chip, in which case the trapped population of cold atoms may be situated above the ion-conducting layer.

An atom chip may be fabricated directly on the ion-conducting layer or on the first electrode. The atom chip traces that generate the magnetic fields for microtraps may be adjacent to the first electrode traces in this case. The atom chip traces that generate the magnetic fields for microtraps may be separated from the ion-conducting layer by a material which is both an electronic insulator and an ionic insulator (e.g., certain glass materials).

Figure 6:
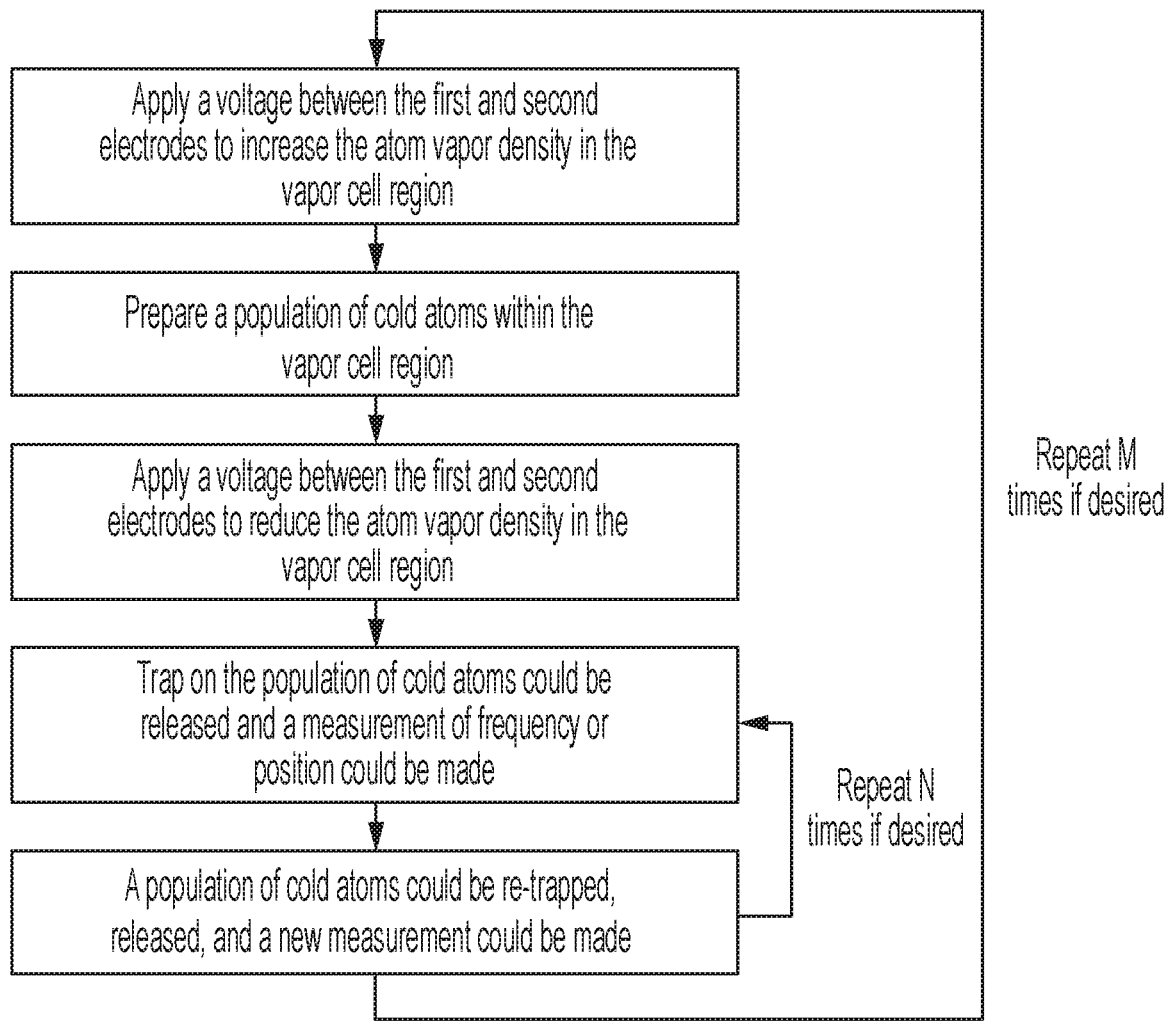
FIG. 6 is an exemplary flowchart depicting a method of using a metal vapor-density control system, in some embodiments.

FIG. 6 is an exemplary flowchart depicting a method of using a metal vapor-density control system, in some embodiments.

Some variations of the invention provide methods for operating a device described herein. Some methods include the following steps or configurations.

In some embodiments, a voltage is applied between the first and second electrodes to reduce the atom vapor density in the vapor-cell region (e.g., evacuate some or all of the metal atoms from a vapor cell). The voltage is applied such the second electrode has a lower electrical potential than the first electrode. This causes mobile ions within the ion-conducting layer to conduct towards the second electrode. If there are ions in the first electrode, which is the case for a MIEC first electrode, mobile ions within the first electrode conduct towards and into the ion-conducting layer. Within the second electrode, at the interface between the ion-conducting phase and the neutral atom-transporting phase, ions from the ion-conducting phase are neutralized by electrons conducting through the electron-conducting phase. This creates a concentration gradient of neutral atoms in the neutral atom-transporting phase of the second electrode, thus causing neutral atoms to diffuse into the neutral atom-transporting phase. The applied voltage also causes adsorbed neutral atoms on the surface of the device near the first electrode to be ionized. The ions conduct through the ion-conducting layer and the electrons conduct within the first electrode. As additional atoms adsorb onto the surface of the device, those atoms will be ionized and pumped into the device.

Based on selection of materials for the first electrode, the phases of the second electrode, and the ion-conducting layer, fast system response times may be achieved. The response time (for sourcing and/or sinking metal atoms) of the system is preferably less than about 10 seconds, more preferably less than about 1 second, and most preferably less than about 0.1 second. In various embodiments, the system response time is about 1, 0.5, 0.2, 0.1, 0.05, 0.04, 0.03, 0.02, or 0.01 seconds.

The system power input for sourcing and/or sinking metal atoms is preferably less than about 500 mW, more preferably less than about 200 mW, and most preferably less than about 100 mW. In various embodiments, the system power input for sourcing and/or sinking metal atoms is about 500 mW, 400 mW, 300 mW, 200 mW, 100 mW, 75 mW, 50 mW, 25 mW, or 10 mW, or less.

A voltage may be applied between the first and second electrodes to increase or decrease the atom vapor density. In various embodiments, the applied voltage is about 10 mV, 25 mV, 50 mV, 100 mV, 200 mV, 300 mV, 400 mV, or 450 mV, or about 0.5 V, 1 V, 5 V, 10 V, 20 V, 50 V, 75 V, or 100 V.

The method may include one or more of the following additional steps.

A voltage may be applied between the first and second electrodes to increase the atom vapor density in a vapor-cell region, e.g. prior to preparing a population of cold atoms within the vapor-cell region. The voltage is applied such that the second electrode has a higher electrical potential than the first electrode. This causes mobile ions within the ion-conducting layer to conduct towards and into the first electrode. Ions from the ion-conducting layer are neutralized by electrons supplied via the first electrode at the interface between the first electrode and the ion-conducting layer, forming neutral atoms. These atomic neutrals then desorb from the surface into the vapor chamber volume, thus increasing the vapor density or vapor pressure in the vapor chamber volume. At the second electrode, neutrals within the neutral atom-transporting phase are ionized at the interface between the atom-transporting phase and the ion-conducting phase. Electrons from this reaction conduct through the electron-conducting phase. Ions conduct through the ion-conducting phase of the second electrode and into the ion-conducting layer (above the second electrode). As the neutral atoms near the interface of the neutral atom-transporting phase and the ion conducting phase are depleted, a concentration gradient forms in the neutral atom-transporting phase, causing neutral atoms to diffuse toward the interface.

A population of cold atoms (e.g., $10^5$ to $10^9$ atoms) at a temperature of, for example, about 0.5 nK to 1000 μK may be prepared within a vapor-cell region prior to applying a voltage between the first and second electrodes. This population may be formed with a magneto-optical trap (MOT), a dipole trap, or a Bose-Einstein condensate, for example. After reducing the vapor pressure as described above, the trap on the population of cold atoms may be released and a measurement of frequency or position may be made. Alternatively, an interferometric measurement using an atom beam may be made. After the measurement, a population of cold atoms may be re-trapped, released, and a new measurement could be made. This step may be repeated multiple times. The entire cycle of steps may be repeated multiple times.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein. This specification hereby incorporates by reference U.S. Pat. No. 10,545,461, issued on Jan. 28, 2020; U.S. Pat. No. 10,056,913, issued on Aug. 21, 2018; U.S. patent application Ser. No. 15/837,346, filed on Dec. 11, 2017; and U.S. patent application Ser. No. 16/573,684, filed on Sep. 17, 2019.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A metal vapor-density control system comprising:
   a first electrode;
   a second electrode that is electrically isolated from said first electrode, wherein said second electrode contains (i) an ion-conducting phase capable of transporting mobile ions and (ii) an atom-transporting phase capable of storing and transporting neutral forms of said mobile ions, wherein interfacial contact area density between said ion-conducting phase and said atom-transporting phase is at least 100 $mm^2$ per $mm^3$; and
   an ion-conducting layer interposed between said first electrode and said second electrode, wherein said ion-conducting layer is capable of transporting said mobile ions, and wherein said ion-conducting layer is in contact with said second electrode.

2. The metal vapor-density control system of claim 1, wherein said first electrode contains a porous, electrically conductive layer or structure.

3. The metal vapor-density control system of claim 1, wherein said first electrode contains a permeable, electrically conductive layer or structure.

4. The metal vapor-density control system of claim 1, wherein said first electrode contains a layer of an intercalation compound.

5. The metal vapor-density control system of claim 1, wherein said second electrode further contains (iii) an electron-conducting phase with an electrical conductivity of at least 0.1 S/cm measured at 25° C.

6. The metal vapor-density control system of claim 1, wherein said ion-conducting phase has an electrical conductivity of at least 0.1 S/cm measured at 25° C.

7. The metal vapor-density control system of claim 1, wherein said ion-conducting phase contains a mixed ion-electron conductor.

8. The metal vapor-density control system of claim 7, wherein said mixed ion-electron conductor is selected from the group consisting of alkali monoferrites, alkali monoaluminates, alkali monogallates, and combinations thereof, optionally doped with one or more atoms selected from the group consisting of Pb, Cd, Ca, P, V, Nb, Ta, Si, Ti, and Ge.

9. The metal vapor-density control system of claim 7, wherein said mixed ion-electron conductor is selected from alkali pyrophosphates, optionally doped with one or more atoms selected from the group consisting of Ca, Sr, Ba, Pb, Y, La, and Nd.

10. The metal vapor-density control system of claim 1, wherein said ion-conducting phase forms a continuous or semi-continuous phase within said second electrode.

11. The metal vapor-density control system of claim 1, wherein said ion-conducting phase is structurally integrated with a side of said ion-conducting layer.

12. The metal vapor-density control system of claim 1, wherein said atom-transporting phase contains an intercalable compound that is intercalative for said neutral forms of said mobile ions.

13. The metal vapor-density control system of claim 12, wherein said intercalable compound is a carbonaceous material selected from the group consisting of graphite, graphene, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

14. The metal vapor-density control system of claim 12, wherein said intercalable compound is a transition-metal oxide, a transition-metal dichalcogenide, or a combination thereof.

15. The metal vapor-density control system of claim 1, wherein said atom-transporting phase has an electrical conductivity of at least 0.1 S/cm measured at 25° C.

16. The metal vapor-density control system of claim 1, wherein said atom-transporting phase is in the form of a plurality of discrete particles within said second electrode.

17. The metal vapor-density control system of claim 1, wherein interfacial contact area between said ion-conducting phase and said atom-transporting phase includes a binder and/or an interfacial layer.

18. The metal vapor-density control system of claim 1, wherein said mobile ions are selected from the group consisting of $Rb^+$, $Cs^+$, $Ca^{2+}$, $Na^+$, $K^+$, $Sr^{2+}$, $Li^+$, $Yb^{3+}$, and combinations thereof.

19. The metal vapor-density control system of claim 1, wherein said ion-conducting layer comprises a solid electrolyte.

20. The metal vapor-density control system of claim 1, wherein said ion-conducting layer comprises a material selected from the group consisting of β-alumina, β″-alumina, and combinations thereof.

21. The metal vapor-density control system of claim 1, wherein said ion-conducting layer comprises a material selected from the group consisting of NASICON, LISICON, KSICON, chalcogenide glasses, and combinations thereof.

22. The metal vapor-density control system of claim 1, wherein said metal vapor-density control system further includes a heater attached thereto, or in thermal or electromagnetic communication therewith.

23. The metal vapor-density control system of claim 1, wherein said metal vapor-density control system is a vapor-cell system comprising a vapor-cell region configured to allow at least one vapor-cell optical path into a vapor-cell vapor phase within said vapor-cell region.

24. The metal vapor-density control system of claim 1, wherein said metal vapor-density control system is an atom-chip system.

25. A metal vapor-density control system comprising:
a first electrode;
a second electrode that is electrically isolated from said first electrode, wherein said second electrode contains (i) an ion-conducting phase capable of transporting mobile ions and (ii) an atom-transporting phase capable of storing and transporting neutral forms of said mobile ions, wherein said atom-transporting phase is in the form of a plurality of discrete particles within said second electrode, wherein said discrete particles have an average minimum dimension from about 100 nanometers to about 500 microns; and
an ion-conducting layer interposed between said first electrode and said second electrode, wherein said ion-conducting layer is capable of transporting said mobile ions, and wherein said ion-conducting layer is in contact with said second electrode.

26. The metal vapor-density control system of claim 25, wherein said average minimum dimension is from about 100 nanometers to about 20 microns.

27. A metal vapor-density control system comprising:
a first electrode;
a second electrode that is electrically isolated from said first electrode, wherein said second electrode contains (i) an ion-conducting phase capable of transporting mobile ions and (ii) an atom-transporting phase capable of storing and transporting neutral forms of said mobile ions, wherein interfacial contact area between said ion-conducting phase and said atom-transporting phase includes a binder and/or an interfacial material; and
an ion-conducting layer interposed between said first electrode and said second electrode, wherein said ion-conducting layer is capable of transporting said mobile ions, and wherein said ion-conducting layer is in contact with said second electrode.

28. The metal vapor-density control system of claim 27, wherein said binder and/or interfacial material is selected from the group consisting of metals, metal alloys, metal oxides, metal carbonates, mixed metal carbonates, carbon, pyrolyzed polymers, polyvinylpyrrolidone, fluoroelastomers, polyacrylates, cellulose resins, and combinations thereof.

* * * * *